US011022704B2

(12) United States Patent
Wu

(10) Patent No.: US 11,022,704 B2
(45) Date of Patent: Jun. 1, 2021

(54) LIGHT DETECTION DEVICE AND OPERATING METHOD THEREOF

(71) Applicant: InnoLux Corporation, Miao-Li County (TW)

(72) Inventor: Chih-Hao Wu, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 167 days.

(21) Appl. No.: 16/520,375

(22) Filed: Jul. 24, 2019

(65) Prior Publication Data
US 2020/0064497 A1 Feb. 27, 2020

(30) Foreign Application Priority Data
Aug. 21, 2018 (CN) .......................... 201810954467.8

(51) Int. Cl.
*H01L 27/144* (2006.01)
*G01T 1/24* (2006.01)

(52) U.S. Cl.
CPC .............. *G01T 1/241* (2013.01); *G01T 1/244* (2013.01); *H01L 27/1446* (2013.01)

(58) Field of Classification Search
CPC ......... G01T 1/161; G01T 1/241; G01T 1/244; H01L 27/1446; H01L 27/14603; H01L 27/14612; H01L 27/14658
See application file for complete search history.

(56) References Cited

U.S. PATENT DOCUMENTS

| 10,658,406 B2* | 5/2020 | Sato .................. H04N 5/37452 |
| 2006/0278811 A1* | 12/2006 | Kim .................. H01L 27/14603 |
| | | 250/208.1 |
| 2007/0187720 A1* | 8/2007 | Park .................... H01L 27/1214 |
| | | 257/206 |
| 2015/0182182 A1 | 7/2015 | Tajima |
| 2017/0264840 A1* | 9/2017 | Hirase .................. H04N 5/363 |

* cited by examiner

*Primary Examiner* — Mark R Gaworecki
(74) *Attorney, Agent, or Firm* — Winston Hsu

(57) ABSTRACT

A light detection device includes a first gate line, a second gate line adjacent to the first gate line, a first switching unit, a second switching unit, and a readout circuit. The first switching unit includes a first gate electrode connected to the first gate line, and a first drain electrode electrically connected to a light sensing unit. The second switching unit includes a second gate electrode connected to the second gate line, and a second drain electrode electrically connected to a light sensing unit. An operation method of the light detection device includes receiving a first readout signal and a second readout signal from the first switching unit and the second switching unit respectively by the readout circuit and calculating a difference between the first readout signal and the second readout signal for determining whether the light detection device is irradiated by detection light.

20 Claims, 11 Drawing Sheets

LIGHT DETECTION DEVICE AND OPERATING METHOD THEREOF

BACKGROUND OF THE DISCLOSURE

1. Field of the Disclosure

The present disclosure relates to a light detection device and an operation method thereof, and more particularly, to a light detection device capable of performing an auto-detection mode and an operation method thereof.

2. Description of the Prior Art

Light sensing technology has been applied in many electronic products and detection equipment, and the light sensing technology capable of detecting X-ray is one of the applications that has received considerable attention. Because of properties such as low irradiation dose, fast electronic imaging, and convenience of viewing, copying, capturing, transferring, and analyzing electronic images, the traditional approach using films for detecting X-ray has been gradually replaced by the digital detection device, and the digital detection device has become the main trend of development of digital medical imaging. Photo diodes are generally used as light sensing units in the digital light detection device for detecting X-ray energy. Generally, connecting the signal between the digital light detection device and the X-ray generation device is still necessary for synchronization, and images may be captured by the digital light detection device under the X-ray irradiations accordingly. However, as the digital light detection device is connected to the X-ray generation device by wire or wirelessly, there will be limitations in use and possible negative effects when synchronization signal is disturbed.

SUMMARY OF THE DISCLOSURE

It is one of the objectives of the present disclosure to provide a light detection device and an operation method thereof. The light detection device is used to perform an auto-detection mode for calculating a difference between readout signals obtained by different switching units and determining whether the light detection device is irradiated by detection light and whether an image capturing mode has to be performed.

A light detection device is provided in an embodiment of the present disclosure. The light detection device includes a first gate line, a second gate line, a first switching unit, a second switching unit, a first light sensing unit, and a gate driving circuit. The second gate line is disposed adjacent to the first gate line. The first switching unit includes a first gate electrode and a first drain electrode. The first gate electrode is connected to the first gate line. The second switching unit includes a second gate electrode and a second drain electrode. The second gate electrode is connected to the second gate line. The first light sensing unit is electrically connected to the first drain electrode and the second drain electrode. The gate driving circuit is electrically connected to the first gate line and the second gate line.

A light detection device is provided in another embodiment of the present disclosure. The light detection device includes a first light sensing unit, a second light sensing unit, a first switching unit, a second switching unit, and a readout circuit. The first light sensing unit is disposed in a first pixel region, and the second light sensing unit is disposed in a second pixel region. The first switching unit includes a first source electrode and a first drain electrode. The second switching unit includes a second source electrode and a second drain electrode. The first drain electrode is electrically connected to the first light sensing unit, and the second drain electrode is electrically connected to the second light sensing unit. The readout circuit is electrically connected to the first drain electrode and the second drain electrode for receiving a first readout signal generated by the first light sensing unit and a second readout signal generated by the second light sensing unit and comparing differences between the first readout signal and the second readout signal in order to determine whether the light detection device is irradiated by detection light or not.

An operating method of a light detection device is provided in another embodiment of the present disclosure. The operating method of the light detection device includes the following steps. Firstly, a light detection device is provided. The light detection device includes a first gate line, a second gate line, a first switching unit, a second switching unit, and a readout circuit. The second gate line is disposed adjacent to the first gate line. The first switching unit includes a first gate electrode, a first source electrode, and a first drain electrode. The first gate electrode is connected to the first gate line. The first drain electrode is electrically connected to a light sensing unit. The second switching unit includes a second gate electrode, a second source electrode, and a second drain electrode. The second gate electrode is connected to the second gate line. The second drain is electrode electrically connected to a light sensing unit. The readout circuit is electrically connected to the first source electrode and the second source electrode. Subsequently, an auto-detection mode is performed. The auto-detection mode includes receiving a first readout signal from the first switching unit and receiving a second readout signal from the second switching unit by the readout circuit and calculating a difference between the first readout signal and the second readout signal for determining whether the light detection device is irradiated by detection light or not.

These and other objectives of the present disclosure will no doubt become obvious to those of ordinary skill in the art after reading the following detailed description of the embodiment that is illustrated in the various figures and drawings.

DETAILED DESCRIPTION

To provide a better understanding of the disclosure to the skilled person in the technical field of the disclosure, exemplary embodiments will be detailed as follows. The exemplary embodiments of the disclosure are illustrated in the accompanying drawings with numbered elements to elaborate the contents and effects to be achieved. The embodiments are only illustrative and are not intended to limit the scope of the present disclosure. Additionally, it can be understood that the terms "include", "comprise" and/or "have" used in the present disclosure may be used to point out the existence of the features, the regions, the steps, the operations, and/or the units, but the existence of one or more other features, regions, steps, operations, units, and/or the combination thereof is not excluded. It should be understood that when an element such as a layer or a region is referred to as being "on" or "extended to" another element (or a variation thereof), it can be directly on or directly extended to the other element, or intervening elements may be presented. In contrast, when an element is referred to as being "directly on" or "directly extended to" another element (or a variation thereof), there are no intervening elements. It should be understood that when an element is referred to as being "coupled with" another element (or a variation thereof), it can be directly coupled with another element or indirectly coupled with (such as electrically connected to) another element through one or more intervening elements. It should also be understood that the features disclosed in the different embodiments of the present disclosure may be recombined with one another to form another embodiment.

Figure 1:
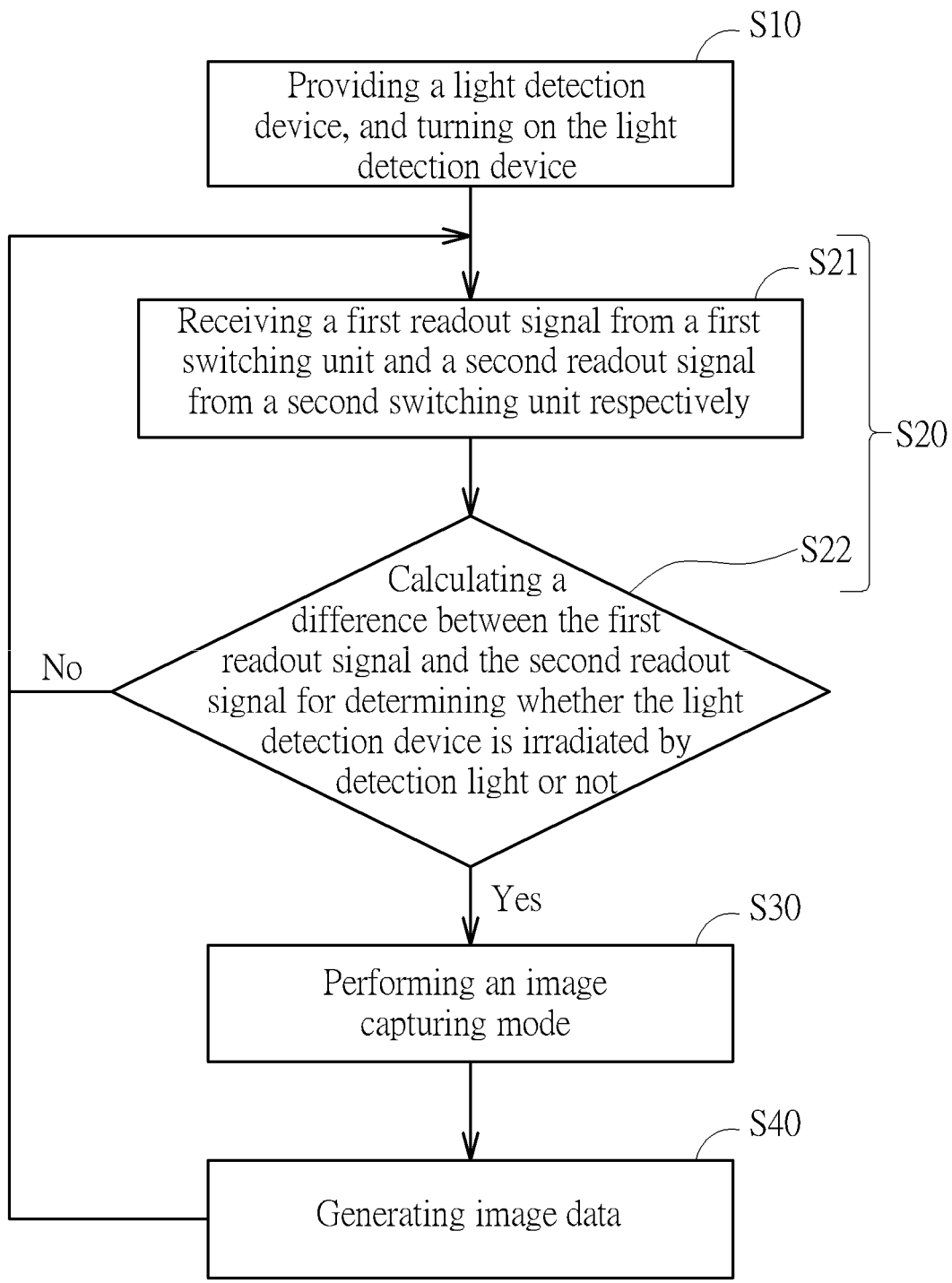
FIG. 1 is a flow chart of an operation method of a light detection device according to a first embodiment of the present disclosure.
Figure 2:
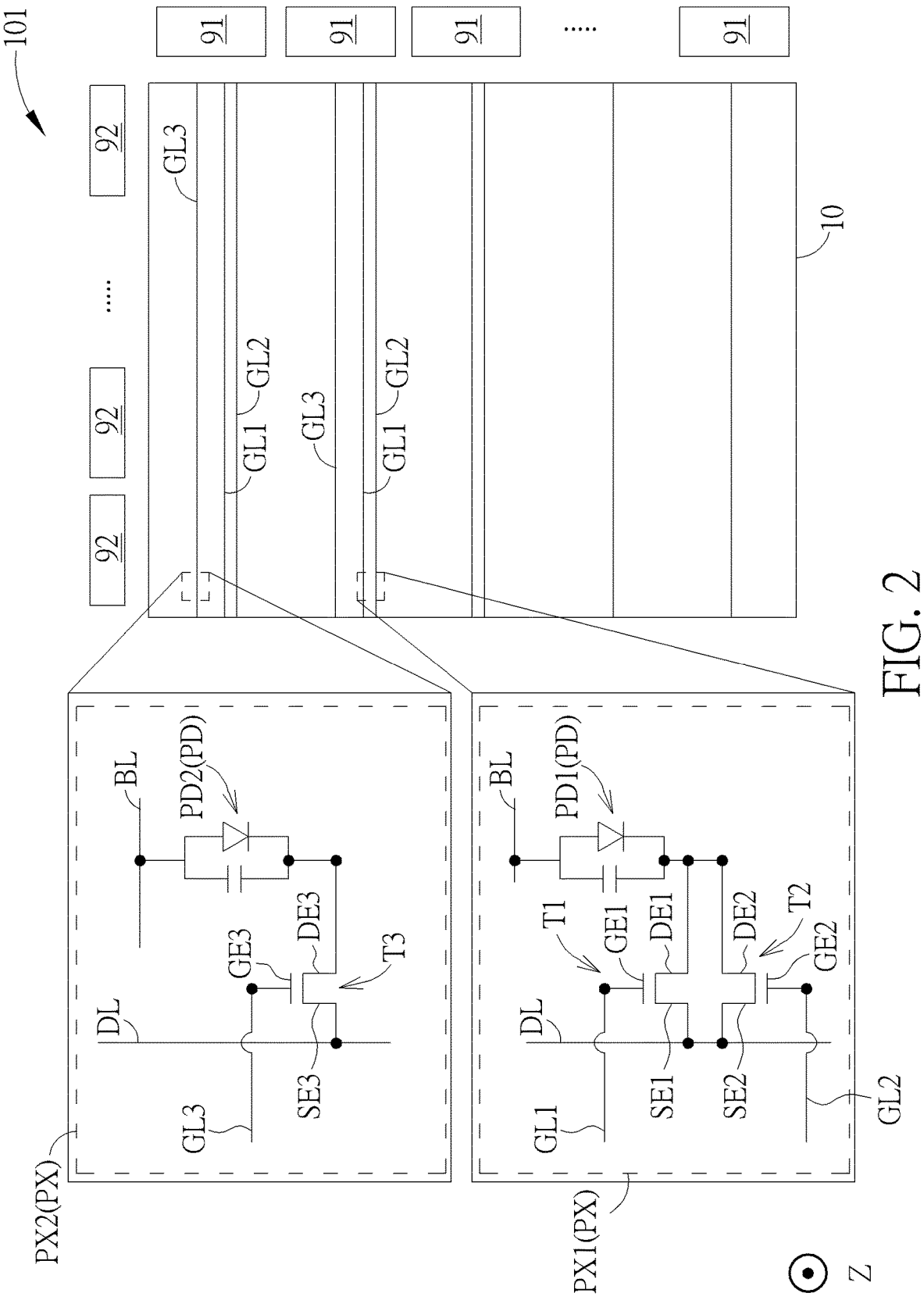
FIG. 2 is a schematic drawing illustrating the light detection device according to the first embodiment of the present disclosure.
Figure 3:
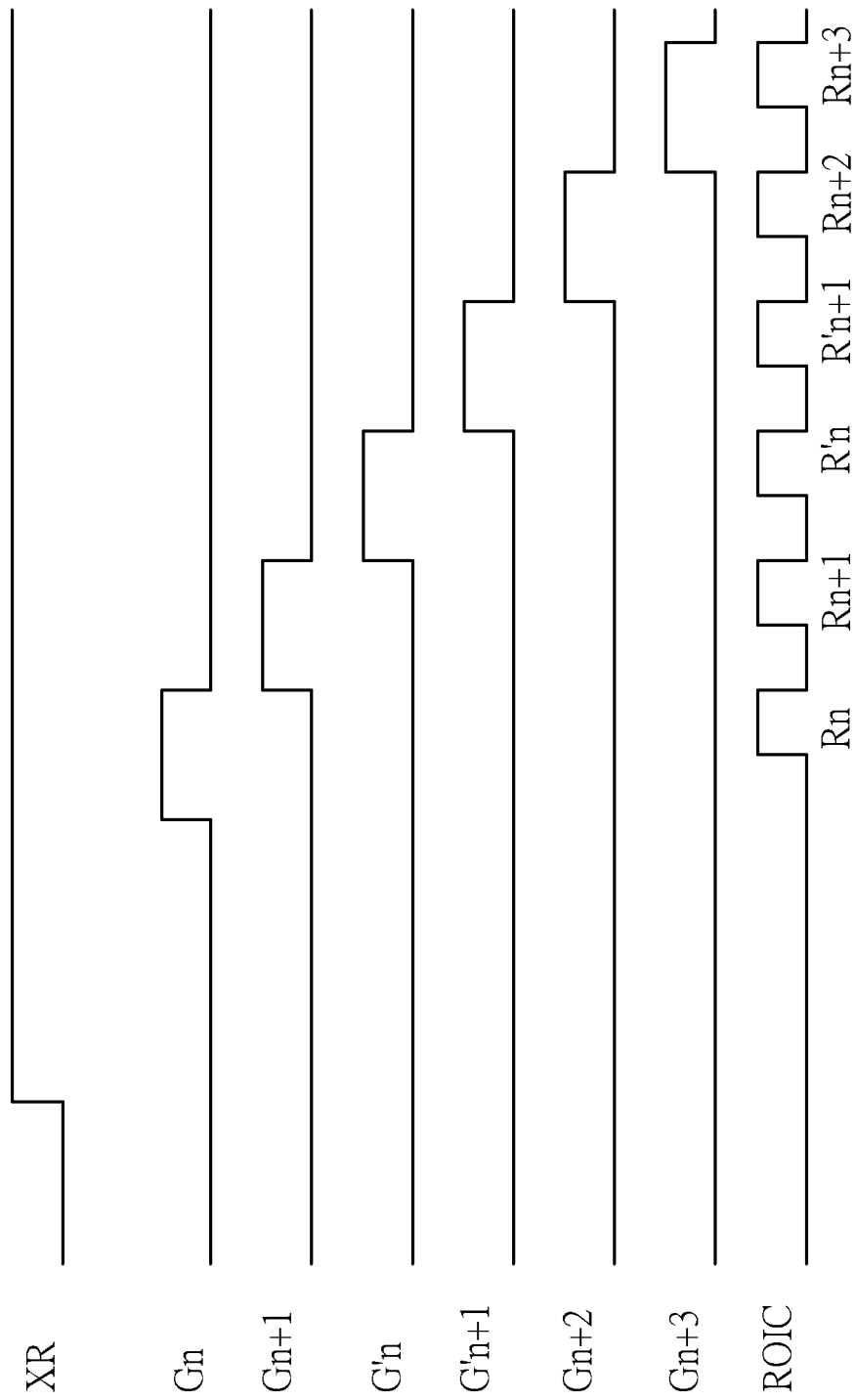
FIG. 3 is a schematic diagram illustrating timings of an operation method of the light detection device according to the first embodiment of the present disclosure.

Please refer to FIG. 1, FIG. 2, and FIG. 3. FIG. 1 is a flow chart of an operation method of a light detection device according to a first embodiment of the present disclosure, FIG. 2 is a schematic drawing illustrating the light detection device in this embodiment, and FIG. 3 is a schematic diagram illustrating timings of an operation method of the light detection device in this embodiment. As shown in FIG. 1 and FIG. 2, an operation method of a light detection device is provided in this embodiment, and the operation method includes the following steps. Firstly, in step S10, a light detection device 101 is provided, and the light detection device 101 is turned on. The light detection device 101 may include a first gate line GL1, a second gate line GL2, a first switching unit T1, and a second switching unit T2. The first switching unit T1 may include a first gate electrode GE1, a first drain electrode DE1, and a first source electrode SE1. The second switching unit T2 may include a second gate electrode GE2, a second drain electrode DE2, and a second source electrode SE2. In some embodiments, the light detection device 101 may include a plurality of data lines DL and a plurality of gate lines GL disposed on a substrate 10, the data lines DL may cross the gate lines GL, and the gate lines GL may include the first gate line GL1 and the second gate line GL2 described above, but not limited thereto. In some embodiments, a plurality of pixel regions PX may be defined on the substrate 10, and the light detection device 101 may include a plurality of light sensing units PD disposed in the pixel regions PX respectively. The light sensing unit PD described above may include a photodiode or other suitable photoelectric conversion units, and the photodiode a capacitor may be connected in parallel according to some considerations, but not limited thereto. The substrate 10 described above may include a glass substrate, a plastic substrate, a ceramic substrate, or a substrate made of other suitable materials. In addition, the light detection device 101 may further include a plurality of gate driving circuits 91 and a plurality of readout circuits 92. Each of the gate driving circuits 91 may be a driver integrated circuit (IC), and each of the readout circuits 92 may be a reading IC, but not limited thereto. Each of the gate driving circuits 91 may be connected to a part of the gate lines GL, and each of the readout circuits 92 may be connected to a part of the data lines DL. In other words, some of the gate lines GL may be connected to different driver ICs respectively, and some of the data lines DL may be connected to different reading ICs respectively, but not limited thereto. In some embodiments, there may be only one gate driving circuit 91 and/or only one readout circuit 92 in the light detection device.

In some embodiments, the second gate line GL2 may be disposed adjacent to the first gate line GL1, the first gate electrode GE1 of the first switching unit T1 may be connected to the first gate line GL1, and the second gate electrode GE2 of the second switching unit T2 may be connected to the second gate line GL2. In addition, the first drain electrode DE1 of the first switching unit T1 may be electrically connected to a light sensing unit PD, and the second drain electrode DE2 of the second switching unit T2 may be electrically connected to a light sensing unit PD also. In some embodiments, the first drain electrode DE1 and the second drain DE2 may be electrically connected to the same light sensing unit PD (such as a first light sensing unit PD1 shown in FIG. 2), but not limited thereto. In some embodiments, the first source electrode SE1 of the first switching unit T1 and the second source electrode SE2 of the second switching unit T2 may be electrically connected to the same readout circuit 92. For instance, the first source electrode SE1 and the second source electrode SE2 may be electrically connected to the same data line DL, and the readout circuit 92 may be electrically connected to the first source electrode SE1 and the second source electrode SE2 via this data line DL, but not limited thereto.

As shown in FIG. 2, the light detection device 101 may further include a plurality of third gate lines GL3 and third switching units T3 connected to the third gate lines GL3 respectively. The third switching unit T3 may include a third gate electrode GE3, a third drain electrode DE3, and a third source electrode SE3. The third gate electrode GE3 may be connected to the third gate line GL3, the third drain electrode DE3 may be electrically connected to a light sensing unit PD (such as a second light sensing unit PD2 shown in FIG. 2), and the third source electrode SE3 may be connected to one of the data lines DL. In some embodiments, the first switching unit T1, the second switching unit T2, and the first light sensing unit PD1 may be disposed in the same pixel region PX (such as a first pixel region PX1 shown in FIG. 2), and the third switching unit T3 and he second light sensing unit PD2 may be disposed in another pixel region PX (such as a second pixel region PX2 shown in FIG. 2), but not limited thereto. The third switching unit T3 and the second light sensing unit PD2 may be regarded as normal components configured for general image capture, and the first switching unit T1, the second switching unit T2, and the first light sensing unit PD1 may be regarded as special components configured for performing an auto-detection mode without being used in the general image capture, but not limited thereto. In some embodiments, the detection light for the light detection device 101 may include an X-ray or light within other suitable wavelength ranges, such as a gamma ray (γ ray). The light sensing unit PD may generates photoelectric conversion when it is irradiated by the corresponding detection light, or a light conversion material (such as a scintillator) may be disposed in the light detection device 101 for converting the detection light into light suitable for photoelectric conversion in the light sensing unit PD (such as visible light), but not limited thereto. Additionally, the light detection device 101 may further include a plurality of bias lines BL, one end of each of the light sensing units PD may be connected to the corresponding switching unit, and another end of each of the light sensing units PD may be connected to the corresponding bias line BL, but not limited thereto.

As shown in FIG. 1, FIG. 2, and FIG. 3, the auto-detection mode (such as step S20 shown in FIG. 1) may be performed after the step S10. In some embodiments, the step S20 may be performed automatically after the step S10. In some embodiments, a standby mode may be performed after the step S10, and the user may decide when to perform the step S20 or perform the step S20 after a determined period. The auto-detection mode may include step S21 and step S22 shown in FIG. 1. In the step S21, the readout circuit 92 may be used to receive a first readout signal (such as a readout signal R'n shown in FIG. 3) from the first switching unit T1 and a second readout signal (such as a readout signal R'n+1 shown in FIG. 3) from the second switching unit T2 respectively. Subsequently, the step S22 is carried on to calculate a difference between the first readout signal (such as the readout signal R'n) and the second readout signal (such as the readout signal R'n+1) for determining whether the light detection device 101 is irradiated by detection light XR or not. Specifically, according to the operation method of the light detection device 101 in this embodiment, under the auto-detection mode, the corresponding switching units may be turned on one by one by driving the gate lines in different time by the gate driving circuit 91, and the corresponding readout signals (such as voltage signals or current signals) may be received sequentially by the readout circuit 92 (such as a readout integrated circuit ROIC shown in FIG. 3) via the date lines DL. For example, a gate electrode signal Gn, a gate electrode signal Gn+1, a gate electrode signal Gn+2, and a gate electrode signal Gn+3 shown in FIG. 3 may be gate electrode signals transmitted to the $n^{th}$ third gate line GL3, the $(n+1)^{th}$ third gate line GL3, the $(n+2)^{th}$ third gate line GL3, and the $(n+3)^{th}$ third gate line GL3 respectively by the gate driving circuit 91, and a gate electrode signal G'n and a gate electrode signal G'n+1 shown in FIG. 3 may be gate electrode signals transmitted to the first gate line GL1 and the second gate line GL2 respectively by the gate driving circuit 91. In the condition described above, the first gate line GL1 and the second gate line GL2 may be disposed between the $(n+1)^{th}$ third gate line GL3 and the $(n+2)^{th}$ third gate line GL3, but not limited thereto. Corresponding to the gate electrode signal Gn, the gate electrode signal Gn+1, the gate electrode signal G'n, the gate electrode signal G'n+1, the gate electrode signal Gn+2, and the gate electrode signal Gn+3, a readout signal Rn, a readout signal Rn+1, a readout signal R'n, a readout signal R'n+1, a readout signal Rn+2, and a readout signal Rn+3 may be received respectively by the readout integrated circuit ROIC.

In other words, a first gate electrode signal (such as the gate electrode signal G'n) may be transmitted to the first switching unit T1 via the first gate line GL1 for turning on the first switching unit T1 and receiving the first readout signal (such as the readout signal R'n), and a second gate electrode signal (such as the gate electrode signal G'n+1) may be transmitted to the second switching unit T2 via the second gate line GL2 for turning on the second switching unit T2 and receiving the second readout signal (such as the readout signal R'n+1). In other words, the first switching unit T1 may be turned on and the first readout signal may be received by transmitting the first gate electrode signal to the first switching unit T1 via the first gate line GL1, and the second switching unit T2 may be turned on and the second readout signal may be received by transmitting the second gate electrode signal to the second switching unit T2 via the second gate line GL2. In addition, the timing of the first gate electrode signal (such as the gate electrode signal G'n) may be different from the timing of the second gate electrode signal (such as the gate electrode signal G'n+1). The first gate line GL1 and the second gate line GL2 are connected to the first gate electrode GE1 and the second gate electrode GE2 respectively, and the first drain electrode DE1 and the second drain electrode DE2 are electrically connected to the first light sensing unit PD1. Therefore, when the light detection device 101 is irradiated by the detection light XR, the first switching unit T1 may be turned on by the gate electrode signal G'n, and the photoelectric conversion result generated by the first light sensing unit PD1 under the irradiation of the detection light XR may be received by the readout integrated circuit ROIC via the first switching unit T1 and the data line DL and become the first readout signal (such as the readout signal R'n). Subsequently, after receiving the readout signal R'n, the second switching unit T2 may be turned on by the gate electrode signal G'n+1, and the second readout signal (such as the readout signal R'n+1) may be received by the readout integrated circuit ROIC.

The photoelectric conversion may be performed to the detection light XR received by the light sensing unit PD, and a predetermined illumination time is required for the light sensing unit PD in order to make the intensity of the readout signal reach the detection requirement. The readout signal R'n+1 may be close to the simple background signal when the gate electrode signal G'n+1 transmitted to the second switching unit T2 is later than the gate electrode signal G'n transmitted to the first switching unit T1 and the timing difference between the gate electrode signal G'n and the gate electrode signal G'n+1 are controlled to be shorter than the illumination time required for detection by the light sensing unit PD. In some embodiments, the background signal may come from unpredictable vibration or background radiation existing in the space, but not limited thereto. Therefore, the light detection device 101 may be determined to be irradiated by the detection light XR when the difference between the first readout signal (such as the readout signal R'n) and the second readout signal (such as the readout signal R'n+1) is larger than a predetermined threshold value. Conversely, the light detection device 101 may be determined to be not irradiated by the detection light XR when the difference between the first readout signal and the second readout signal is not larger than the predetermined threshold value. In the operation method described above, the timing difference between the gate electrode signal G'n and the gate electrode signal G'n+1 has to be controlled for making the readout signal R'n+1 closer to the background signal, and the first gate line GL1 and the second gate line GL2 are electrically connected to the same gate driving circuit 91 preferably for avoiding making the timing difference between the gate electrode signal G'n and the gate electrode signal G'n+1 out of control and simplifying the circuit design of the gate driving circuits 91, but not limited thereto. In some embodiments, all of the first gate lines GL1 and all of the second gate lines GL2 disposed on the substrate 10 may be electrically connected to the same gate driving circuit 91. In some embodiments, the gate driving circuits 91 may scan synchronously, the first readout signals may be received from the first switching units T1 corresponding to different gate driving circuits 91 respectively, and the second readout signals may be received from the second switching units T2 corresponding to different gate driving circuits 91 respectively. The light detection device 101 may be determined to be irradiated by the detection light XR or not by summing up the first readout signals and the second readout signals and calculating the differences. The time required to perform the auto-detection mode may be reduced, the dose of the detection light XR irradiating a patient may be reduced, or the sensitivity of the auto-detection mode may be increased because the gate driving circuits 91 scan synchronously. Therefore, when the light detection device 101 is determined to be irradiated by the detection light XR in the step S22, step S30 may be carried on for terminating the auto-detection mode and performing an image capturing mode, and the corresponding image date may be generated in step S40 subsequently. The step S20 may be carried on again after the step S40 for performing the auto-detection mode or the standby mode mentioned above, but not limited thereto. Comparatively, when the light detection device 101 is determined to be not irradiated by the detection light XR in the step S22, the step S21 may be repeated for keeping the light detection device 101 in the auto-detection mode. In other words, the auto-detection mode is used to determine whether the light detection device 101 is irradiated by detection light XR or not, and the image capturing mode is used to perform the normal detection light image capture by the light detection device 101. In some embodiments, according to some considerations, the first gate lines GL1 and the second gate lines GL2 may be driven in the auto-detection mode without driving at least a part of the third gate lines GL3 for reducing the power consumption of the auto-detection mode, but not limited thereto. Additionally, the first switching units T1 and the second switching units T2 may be disposed at predetermined locations according to some considerations, and all of the switching units corresponding to the first gate lines GL1 and the second gate lines GL2 may be used in the auto-detection mode without being used in the image capturing mode, but not limited thereto. In some embodiments, the image capturing mode is performed after terminating the auto-detection. The photoelectric conversion may be performed to the detection light by the second light sensing units PD2 within a predetermined illumination time, the corresponding third switching units T3 may be turned on one by one by driving the third gate lines GL3 in different time by the gate driving circuit 91, and the corresponding readout signals may be received sequentially by the readout circuit 92 via the date lines DL for performing the normal detection light image capture, but not limited thereto.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 4:
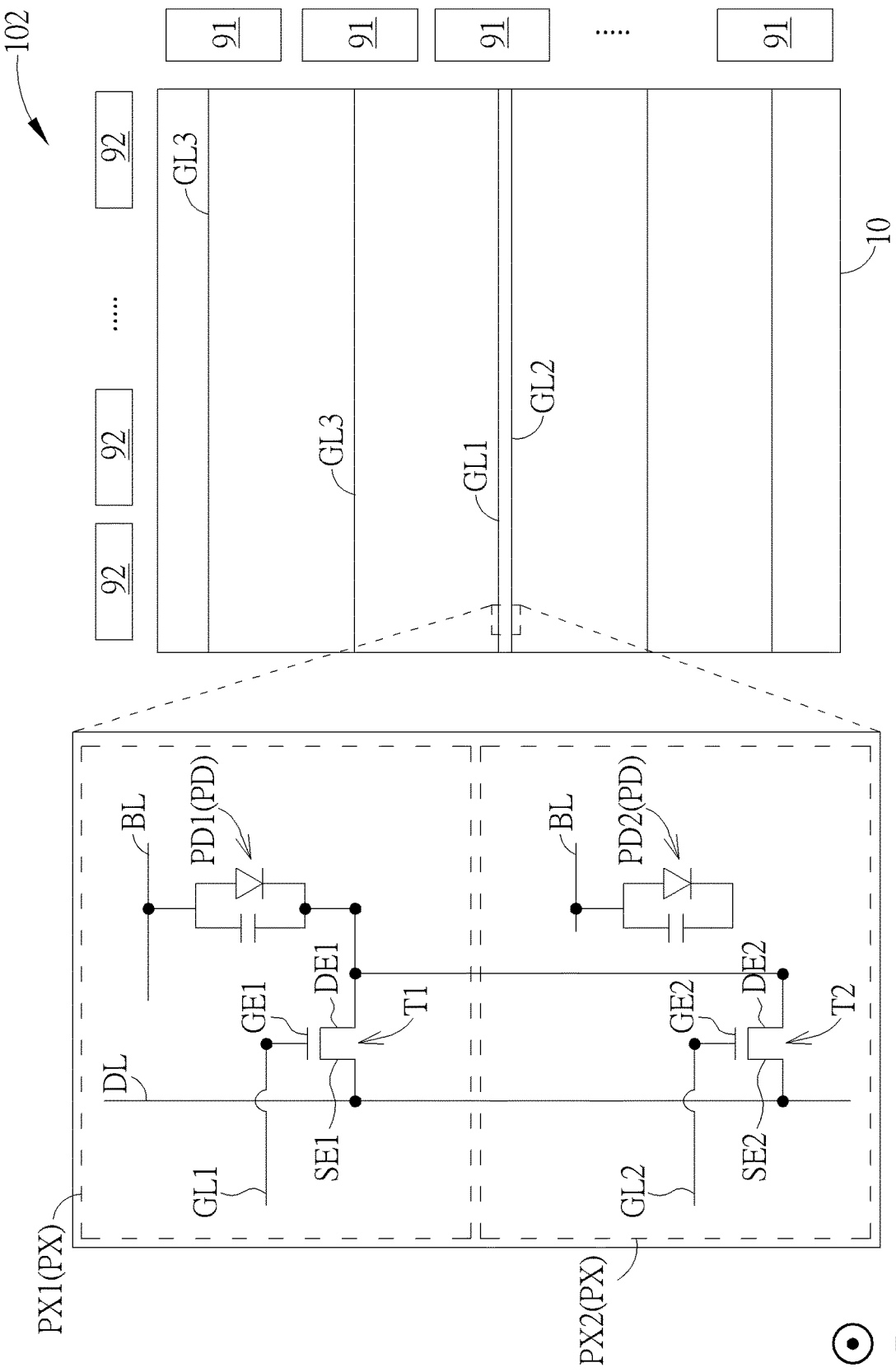
FIG. 4 is a schematic drawing illustrating a light detection device according to a second embodiment of the present disclosure.
Figure 5:
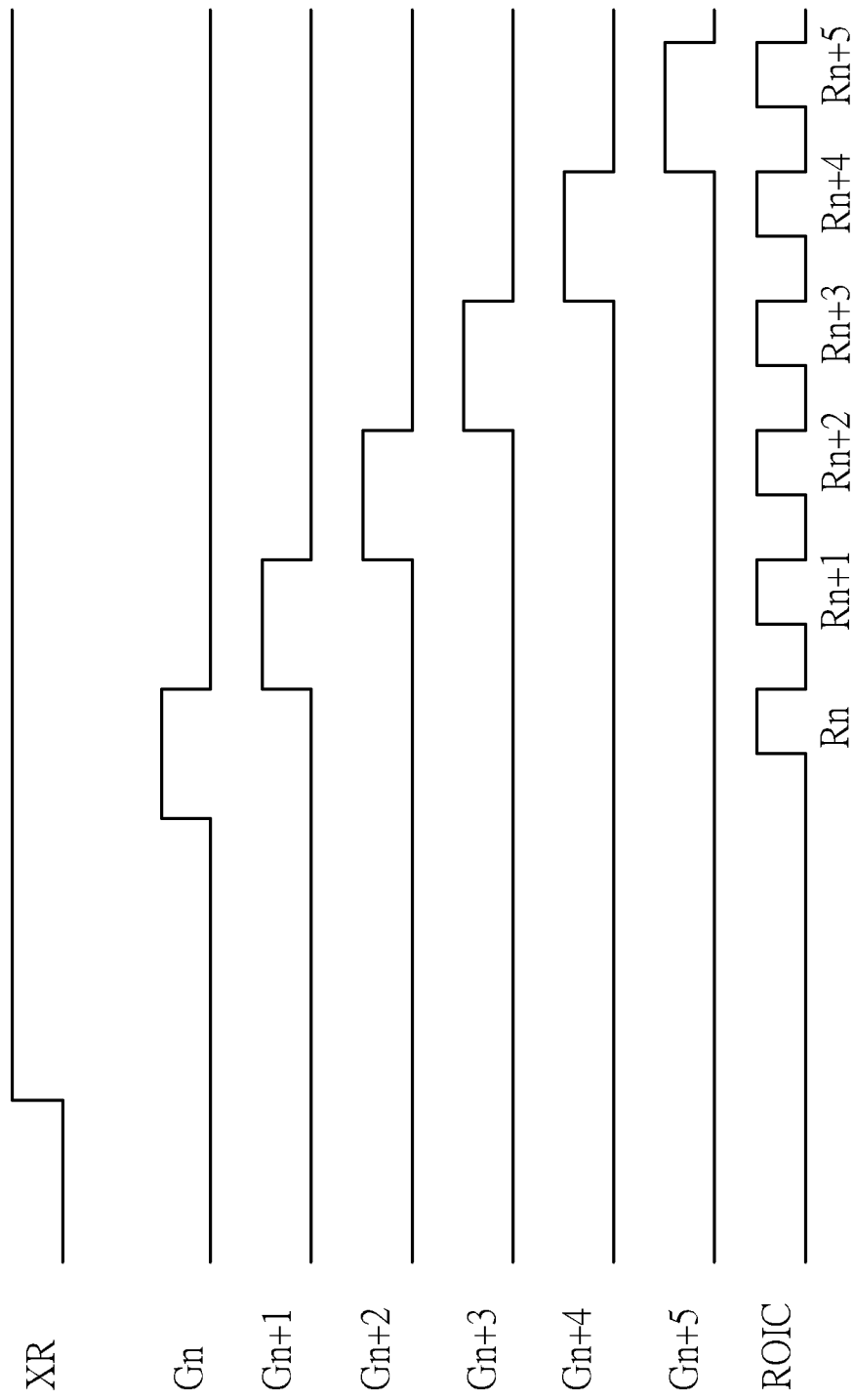
FIG. 5 is a schematic diagram illustrating timings of an operation method of the light detection device according to the second embodiment of the present disclosure.

Please refer to FIG. 4 and FIG. 5. FIG. 4 is a schematic drawing illustrating a light detection device 102 according to a second embodiment of the present disclosure, and FIG. 5 is a schematic diagram illustrating timings of an operation method of the light detection device in this embodiment. As shown in FIG. 4 and FIG. 5, the difference between the light detection device in this embodiment and the light detection device in the first embodiment described above is that, in this embodiments, the first switching unit T1 and the first light sensing unit PD1 may be disposed in the first pixel region PX1, the second switching unit T2 and the second light sensing unit PD2 may be disposed in the second pixel region PX2 adjacent to the first pixel region PX1, and the second switching unit T2 is electrically isolated from the second light sensing unit PD2. In other words, the first switching unit T1 and the second switching unit T2 in this embodiment may be disposed in different pixel regions PX respectively, and the first switching unit T1 and the second switching unit T2 are still electrically connected to the same light sensing unit PD. In addition, the second light sensing unit PD2 cannot be used in the auto-detection mode and the image capturing mode described above because the second light sensing unit PD2 in this embodiment is not connected to a switching unit, but the second light sensing unit PD2 may be regarded as a dummy sensing unit for avoiding loading effect influencing the process condition in the manufacturing process of the light detection device 102. In some embodiments, the second light sensing unit PD2 may not be manufactured, and the second pixel region PX2 may not include the second light sensing unit PD2. Additionally, the driving approach of the first gate line GL1 and the second gate line GL2 may be similar to that of the normal gate lines (such as the third gate lines GL3) because the first gate line GL1 and the second gate line GL2 may be disposed corresponding to different pixel region PX in this embodiment. For example, in the operation method of the light detection device 102 according to this embodiment, a gate electrode signal Gn, a gate electrode signal Gn+1, a gate electrode signal Gn+4, and a gate electrode signal Gn+5 shown in FIG. 5 may be gate electrode signals transmitted to the $n^{th}$ normal gate line (such as the third gate line GL3), the $(n+1)^{th}$ normal gate line, the $(n+4)^{th}$ normal gate line, and the $(n+5)^{th}$ normal gate line respectively by the gate driving circuit 91, and a gate electrode signal Gn+2 and a gate electrode signal Gn+3 shown in FIG. 5 may be gate electrode signals transmitted to the first gate line GL1 and the second gate line GL2 respectively by the gate driving circuit 91. In other words, the first gate line GL1 and the second gate line GL2 may be regarded as the $(n+2)^{th}$ normal gate line and the $(n+3)^{th}$ normal gate line respectively, but not limited thereto. Corresponding to the gate electrode signal Gn, the gate electrode signal Gn+1, the gate electrode signal Gn+2, the gate electrode signal Gn+3, the gate electrode signal Gn+4, and the gate electrode signal Gn+5, a readout signal Rn, a readout signal Rn+1, a readout signal Rn+2, a readout signal Rn+3, a readout signal Rn+4, and a readout signal Rn+5 may be received respectively by the readout integrated circuit ROIC. The readout signal Rn+2 and the readout signal Rn+3 may be the first readout signal and the second readout signal received from the first switching unit T1 and the second switching unit T2 respectively by the readout circuit 92, and the difference between the first readout signal (such as the readout signal Rn+2) and the second readout signal (such as the readout signal Rn+3) may be calculated for determining whether the light detection device 102 is irradiated by detection light XR or not.

Figure 6:
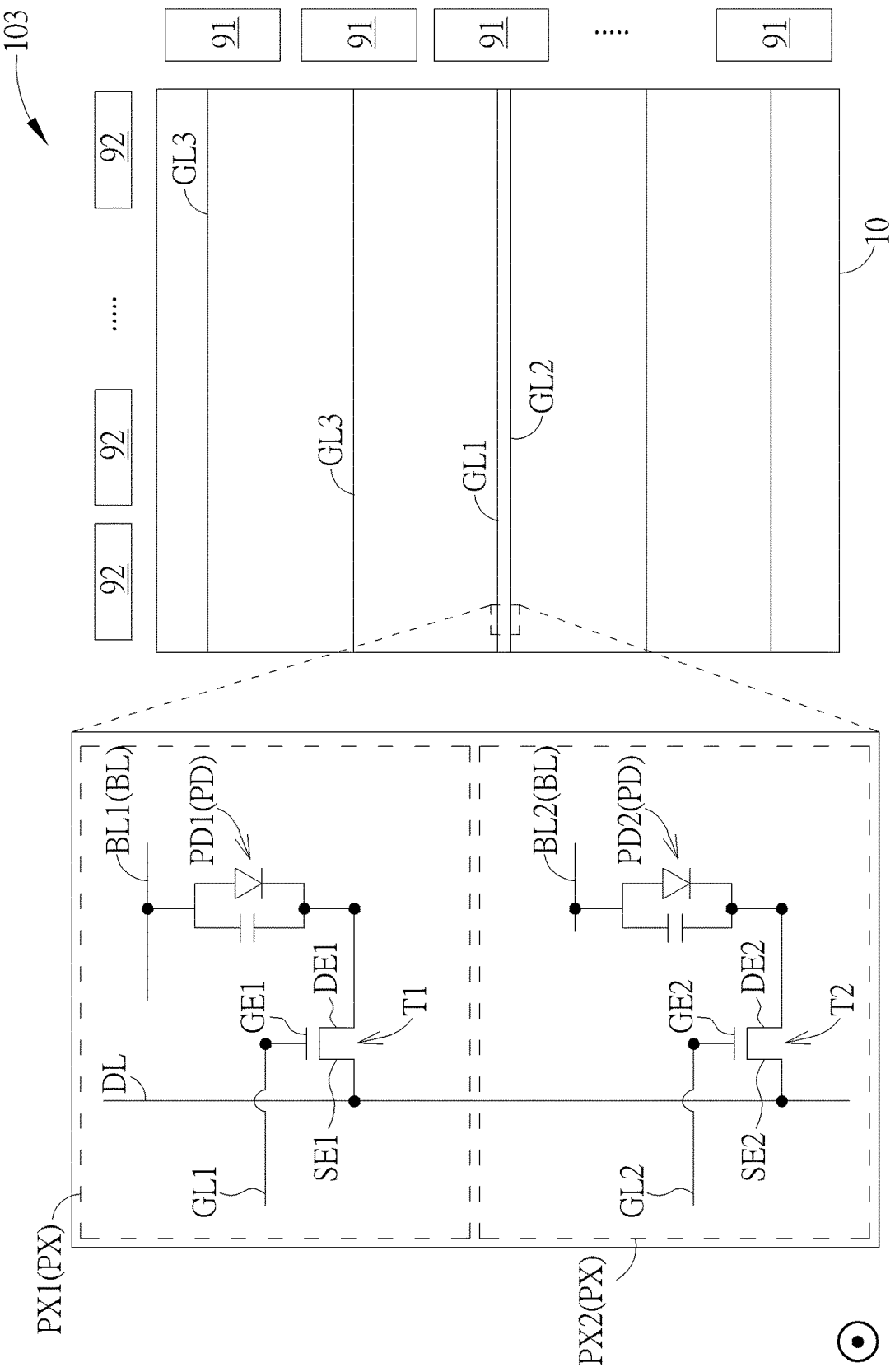
FIG. 6 is a schematic drawing illustrating a light detection device according to a third embodiment of the present disclosure.
Figure 7:
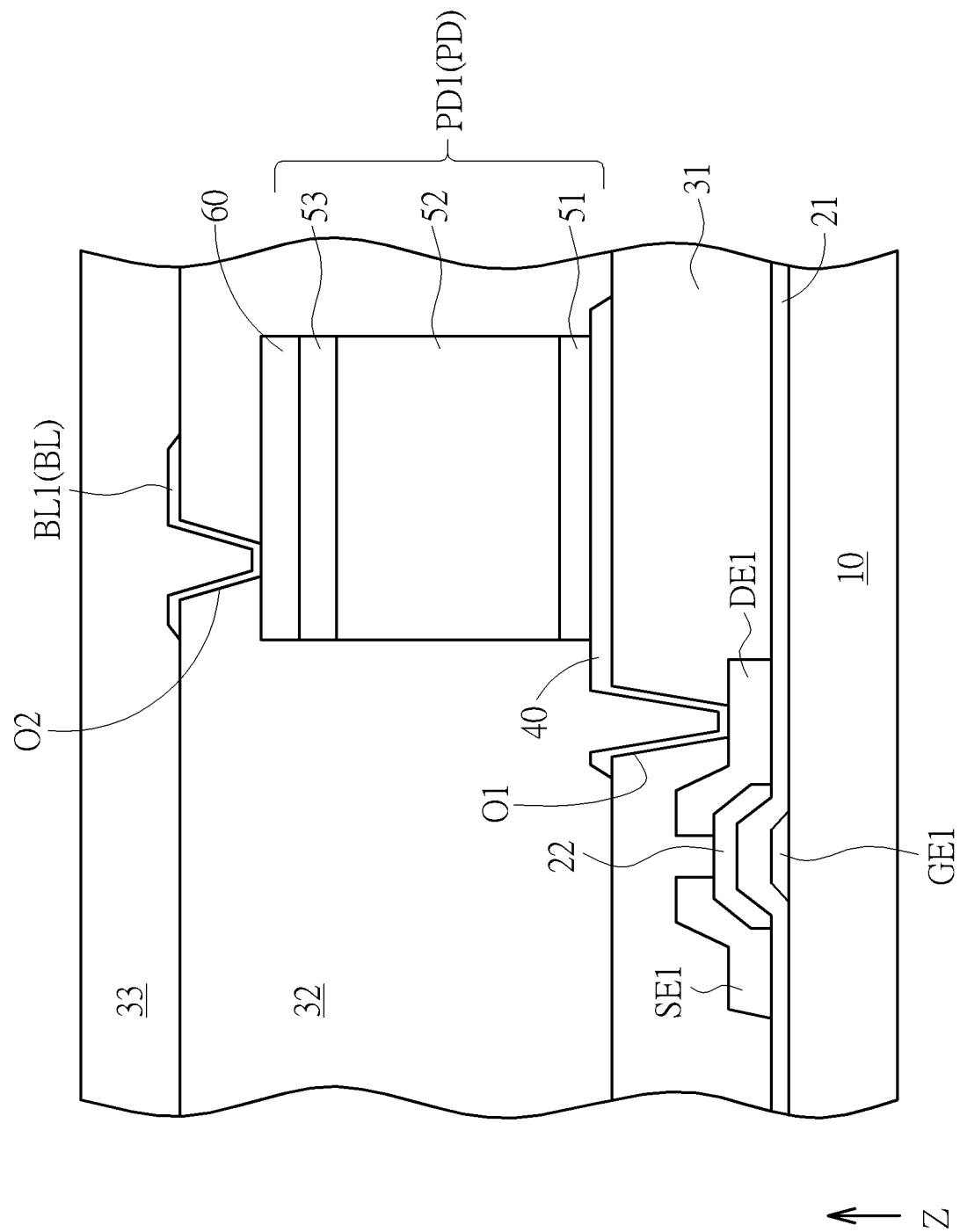
FIG. 7 is a cross-sectional schematic drawing illustrating a first pixel region of the light detection device according to the third embodiment of the present disclosure.
Figure 8:
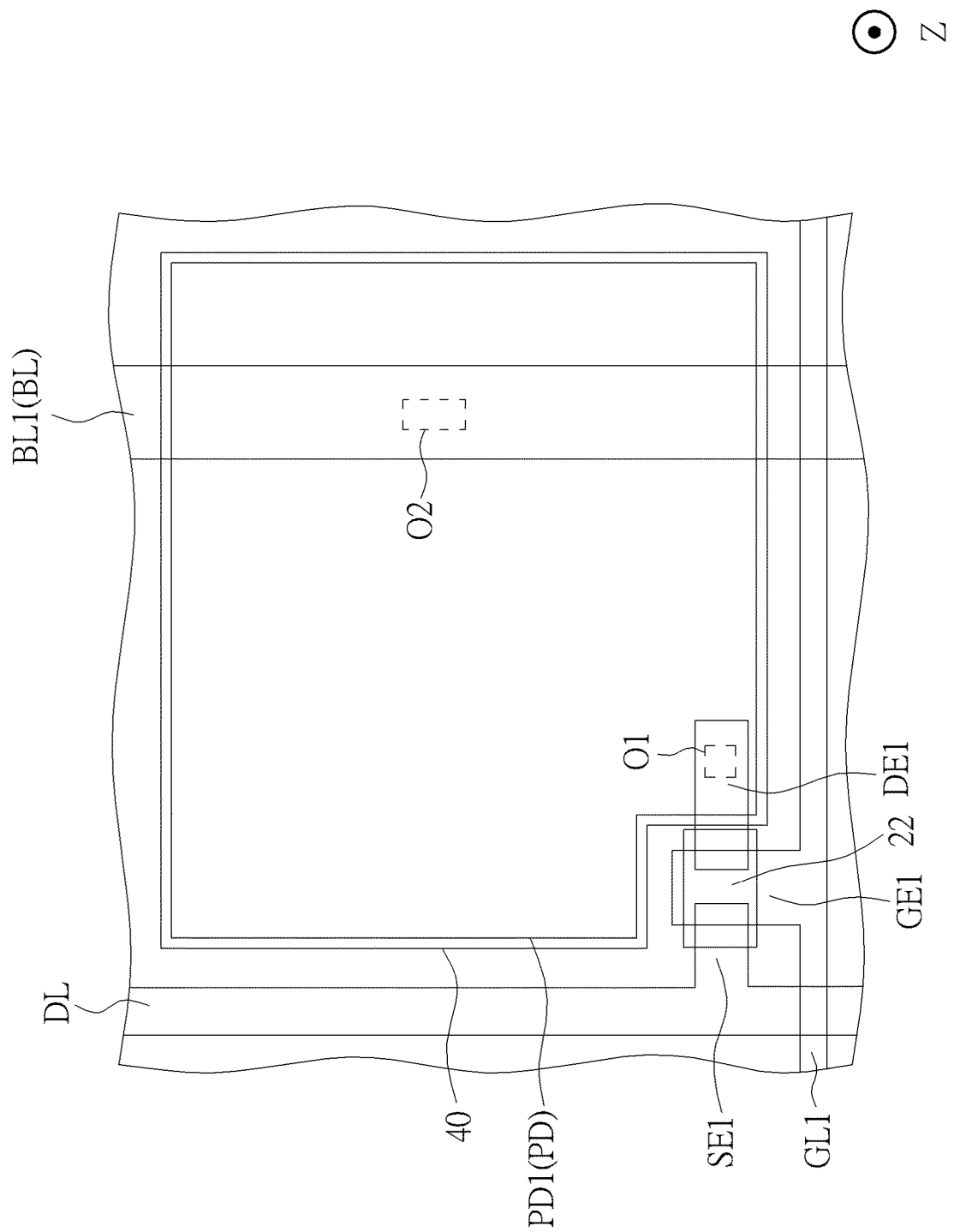
FIG. 8 is a top view schematic drawing illustrating the first pixel region of the light detection device according to the third embodiment of the present disclosure.
Figure 9:
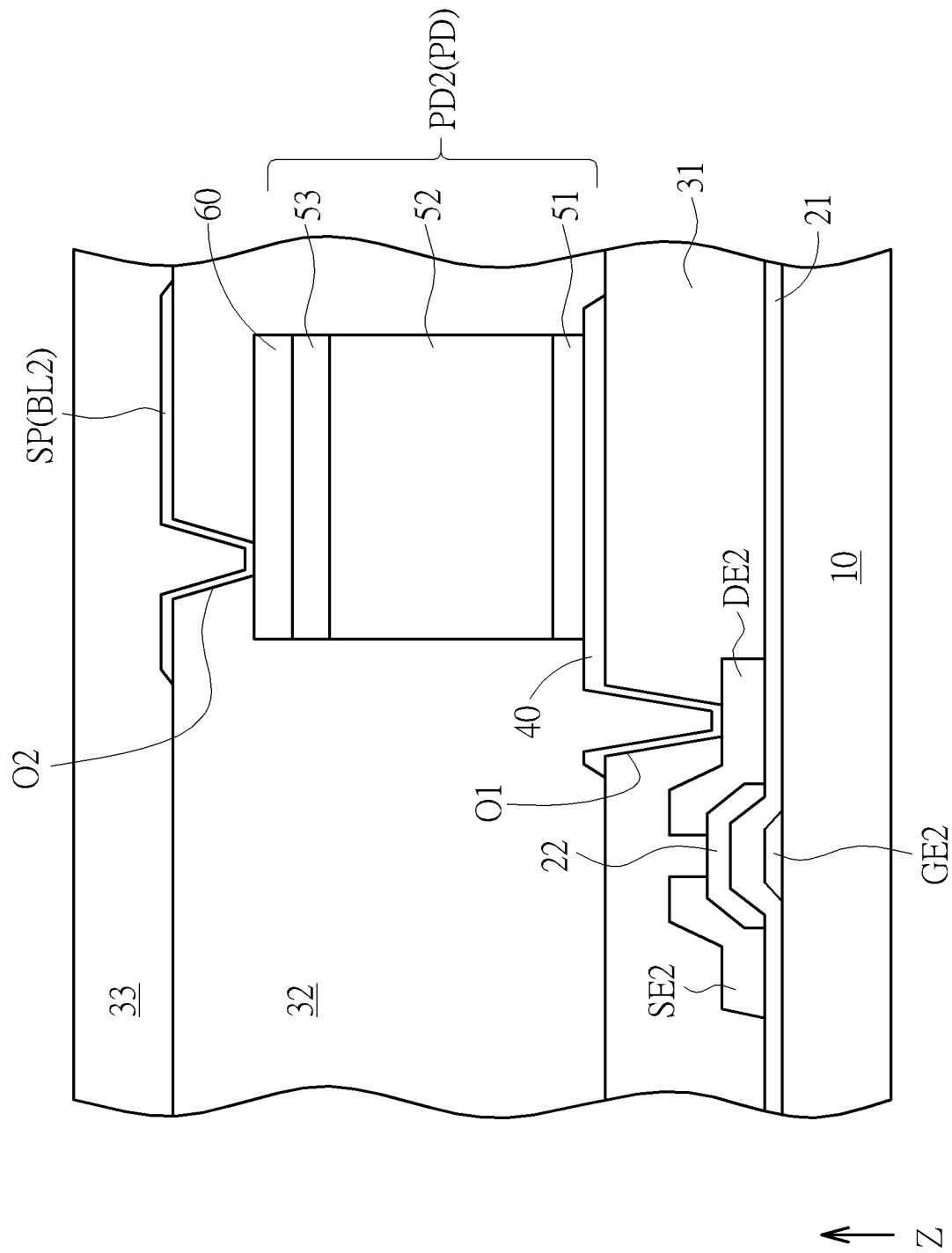
FIG. 9 is a cross-sectional schematic drawing illustrating a second pixel region of the light detection device according to the third embodiment of the present disclosure.
Figure 10:
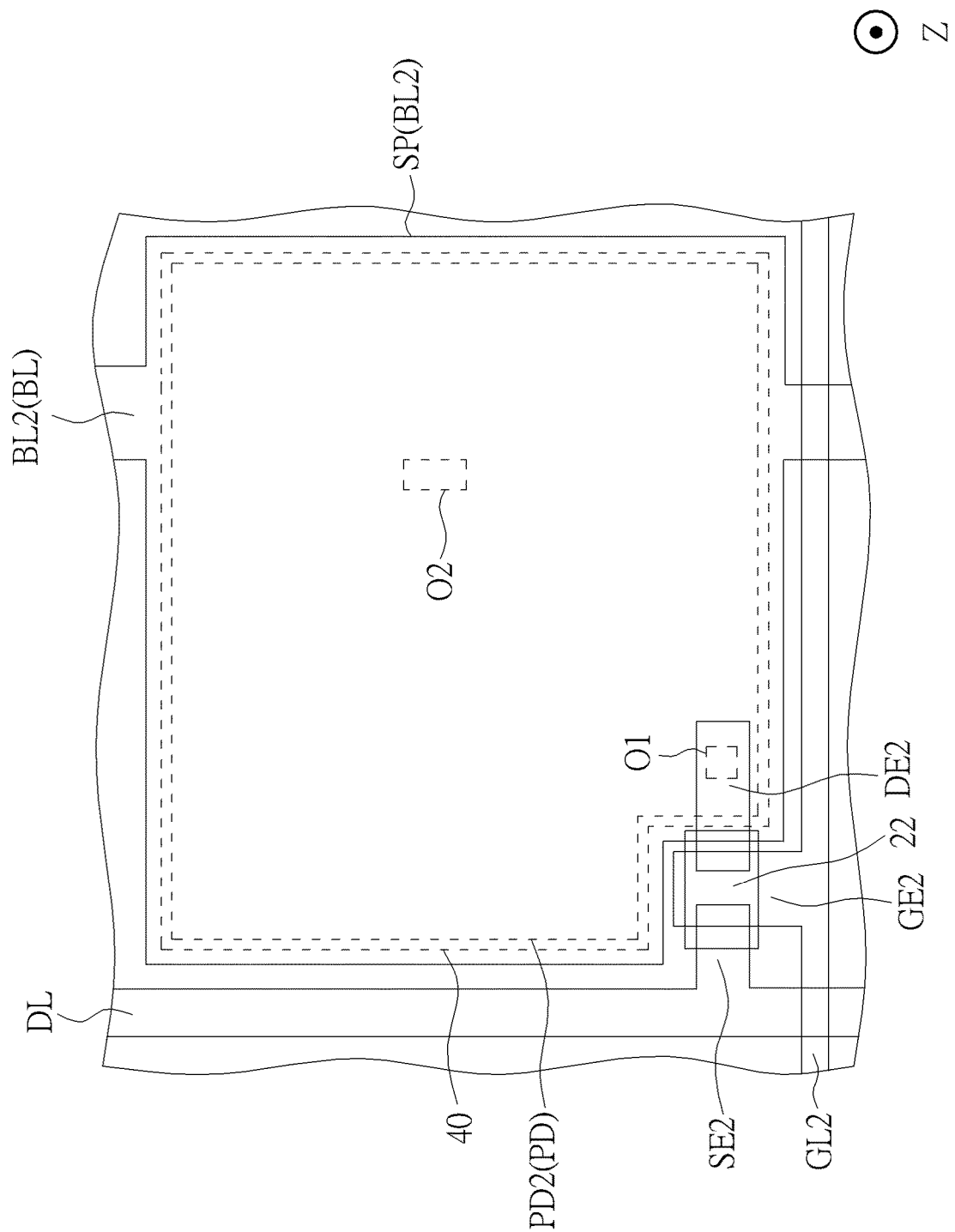
FIG. 10 is a top view schematic drawing illustrating the second pixel region of the light detection device according to the third embodiment of the present disclosure.

Please refer to FIG. 6, FIG. 7, FIG. 8, FIG. 9, and FIG. 10. FIG. 6 is a schematic drawing illustrating a light detection device 103 according to a third embodiment of the present disclosure, FIG. 7 is a cross-sectional schematic drawing illustrating the first pixel region PX1 in this embodiment, FIG. 8 is a top view schematic drawing illustrating the first pixel region PX1 in this embodiment, FIG. 9 is a cross-sectional schematic drawing illustrating the second pixel region PX2 in this embodiment, and FIG. 10 is a top view schematic drawing illustrating the second pixel region PX2 in this embodiment. As shown in FIG. 6, the difference between the light detection device in this embodiment and the light detection device in the second embodiment described above is that, in the light detection device 103, the first drain electrode DE1 is electrically connected to the first light sensing unit PD1, and the second drain electrode DE2 is electrically connected to the second light sensing unit PD2. In other words, the first switching unit T1 and the second switching unit T2 in this embodiment may be electrically connected to different light sensing units PD, and the light sensing unit PD electrically connected to the first drain electrode DE1 and the light sensing unit PD electrically connected to the second drain electrode DE2 may be disposed in different pixel regions PX respectively. Additionally, as shown in FIG. 6, FIG. 7, FIG. 8, FIG. 9, and FIG. 10, the light detection device 103 may further include a light shielding pattern SP covering the second light sensing unit PD2, and the light is not blocked from irradiating the first light sensing unit PD1 by the light shielding pattern SP. In this embodiment, the readout circuit 92 may be electrically connected to the first source electrode SE1 and the second source electrode SE2 for receiving the first readout signal (such as the readout signal Rn+2 shown in FIG. 5 described above) generated by the first light sensing unit PD1 and the second readout signal (such as the readout signal Rn+3 shown in FIG. 5 described above) generated by the second light sensing unit PD2. The second readout signal generated by the second light sensing unit PD2 may be close to the background signal because the second light sensing unit PD2 is covered by the light shielding pattern SP, and the first readout signal generated by the first light sensing unit PD1 may be a signal corresponding to the detection light. Therefore, the readout circuit 92 may be used to compare differences between the first readout signal and the second readout signal in order to determine whether the light detection device 103 is irradiated by detection light or not. It is worth noting that the first light sensing unit PD1 and the second light sensing unit PD2 are disposed in pixel regions PX adjacent to each other preferably. In other words, the pixel region PX1 and the second pixel region PX2 are disposed adjacent to each other preferably for keeping the accuracy of determination in the auto-detection mode from being influenced by the difference between background signals on different regions, but not limited thereto.

As shown in FIG. 6, FIG. 7, FIG. 8, FIG. 9, and FIG. 10, in some embodiments, a gate dielectric layer 21 and a semiconductor channel layer 22 may be disposed on the first gate electrode GE1 and the second gate electrode GE2. A first dielectric layer 31 may cover the switching units, and the first drain electrode DE1 and the second drain electrode DE2 may be electrically connected to a lower electrode 40 respectively via openings O1 in the first dielectric layer 31. The material of the semiconductor channel layer 22 may be low temperature poly-silicon (LTPS), indium gallium zinc oxide (IGZO), or amorphous silicon (a-Si), but not limited thereto. Additionally, the first light sensing unit PD1 and the second light sensing unit PD2 may be disposed on the corresponding lower electrode 40 respectively, and the first light sensing unit PD1 and the second light sensing unit PD2 may respectively include an N type semiconductor layer 51, an intrinsic semiconductor layer 51, and a P type semiconductor layer 53, but not limited thereto. The material of the intrinsic semiconductor layer 52 may include intrinsic amorphous silicon, the material of the N type semiconductor layer 51 may include N type doped amorphous silicon, and the material of the P type semiconductor layer 53 may include P type doped amorphous silicon, but not limited thereto. Additionally, upper electrodes 60 may be disposed on the first light sensing unit PD1 and the second light sensing unit PD2 respectively, and a second dielectric layer 32 may cover the first light sensing unit PD1 and the second light sensing unit PD2. The light detection device 103 may further include a first bias line BL1 and a second bias line BL2. The first bias line BL1 may be partially disposed in the first pixel region PX1, and the first bias line BL1 may be electrically connected to the first light sensing unit PD1 via the upper electrode 60 and an opening O2 in the second dielectric layer 32. The second bias line BL2 may be partially disposed in the second pixel region PX2, and the second bias line BL2 may be electrically connected to the second light sensing unit PD2 via the upper electrode 60 and an opening O2 in the second dielectric layer 32. In addition, a third dielectric layer 33 may be disposed on the second dielectric layer 32 for covering the first bias line BL1 and the second bias line BL2, but not limited thereto. In some embodiments, a part of the second bias line BL2 may be used to form the light shielding pattern SP described above, and a projection area of the light shielding pattern SP in a thickness direction Z of the substrate 10 may be larger than a projection area of the second light sensing unit PD2 in the thickness direction Z of the substrate 10 for keeping the second light sensing unit PD2 from being irradiated by the detection light, but not limited thereto. In some embodiments, the light shielding pattern SP may also be formed by other approaches and/or other materials according to some considerations.

Figure 11:
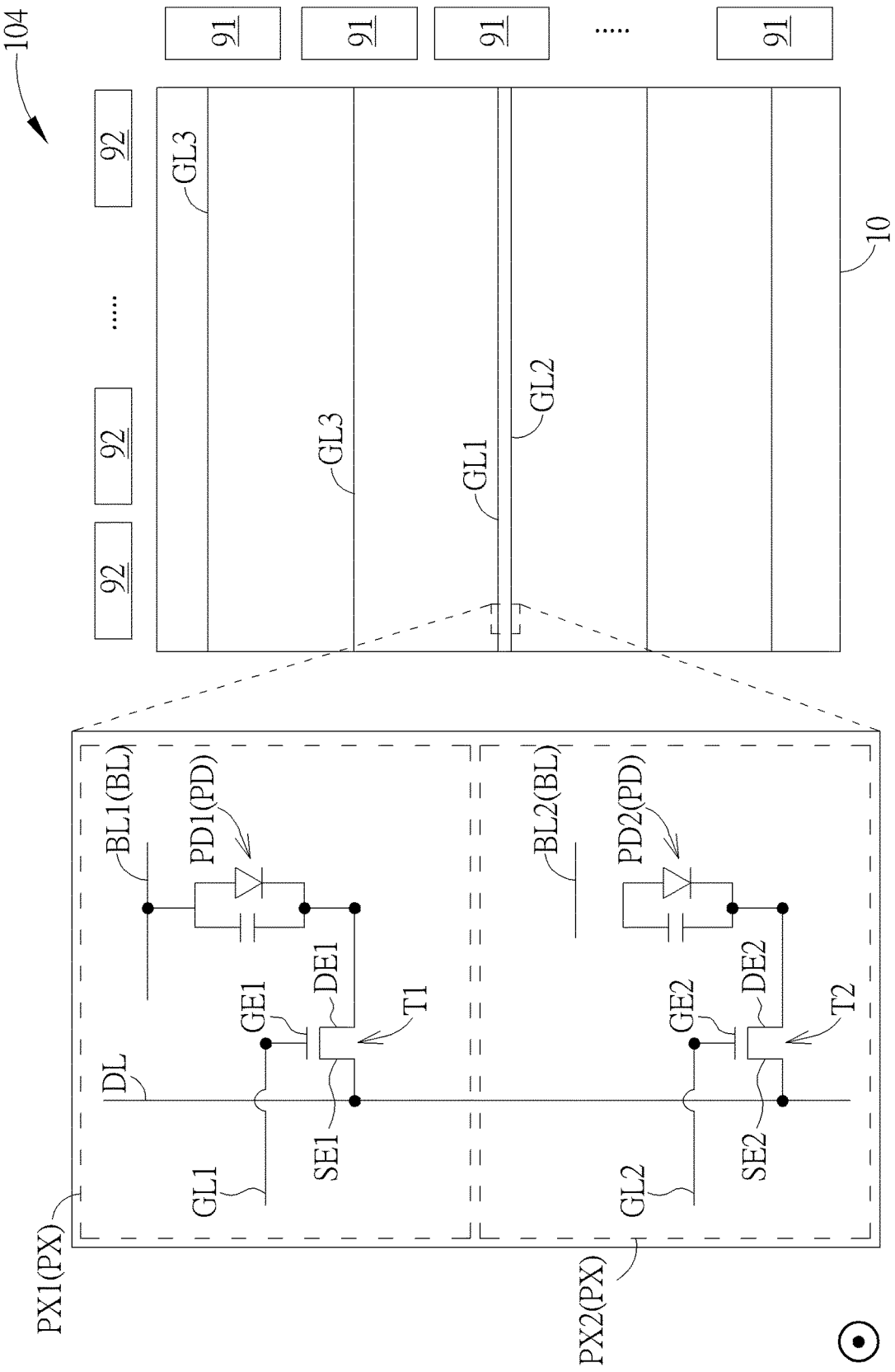
FIG. 11 is a schematic drawing illustrating a light detection device according to a fourth embodiment of the present disclosure.

Please refer to FIG. 11. FIG. 11 is a schematic drawing illustrating a light detection device 104 according to a fourth embodiment of the present disclosure. As shown in FIG. 11, the difference between the light detection device in this embodiment and the light detection device in the third embodiment described above is that the second light sensing unit PD2 in this embodiment may be electrically isolated from the second bias line BL2. In other words, the second light sensing unit PD2 in this embodiment may not be electrically connected to any bias line BL, and the second readout signal received from the second switching unit T2 may be close to the background signal accordingly. Comparatively, the first readout signal generated by the first light sensing unit PD1 may be the signal corresponding to the detection light still, and the differences between the first readout signal and the second readout signal may be compared in order to determine whether the light detection device 104 is irradiated by detection light or not. In addition, the pixel region PX1 with the first light sensing unit PD disposed therein and the second pixel region PX2 with the second light sensing unit PD2 disposed therein may be disposed adjacent to each other preferably for keeping the accuracy of determination in the auto-detection mode from being influenced by the difference between background signals on different regions, but not limited thereto.

To summarize the above description, in the light detection device and the operation method thereof according to the present disclosure, the light detection device may be used to perform the auto-detection mode for calculating the difference between the readout signals obtained by different switching units and determining whether the light detection device is irradiated by the detection light or not and whether the image capturing mode has to be performed or not. Therefore, the light detection device in the present disclosure does not have to be synchronized with the detection light generation device (such as an X-ray generation device) by connection approaches, and the purposed of simplifying the detection device and simplifying the detection operation may be achieved accordingly.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A light detection device, comprising:
   a first gate line;
   a first switching unit, comprising:
      a first gate electrode connected to the first gate line; and
      a first drain electrode;
   a second gate line disposed adjacent to the first gate line;
   a second switching unit, comprising:
      a second gate electrode connected to the second gate line; and
      a second drain electrode;
   a first light sensing unit electrically connected to the first drain electrode and the second drain electrode; and
   a gate driving circuit electrically connected to the first gate line and the second gate line.

2. The light detection device according to claim 1, wherein the first switching unit, the second switching unit, and the first light sensing unit are disposed in one pixel region.

3. The light detection device according to claim 1, further comprising:
   a second light sensing unit, wherein the first switching unit and the first light sensing unit are disposed in a first pixel region, the second switching unit and the second light sensing unit are disposed in a second pixel region adjacent to the first pixel region, and the second switching unit is electrically isolated from the second light sensing unit.

4. The light detection device according to claim 1, further comprising:
   a data line, wherein the first switching unit further comprises a first source electrode, the second switching unit further comprises a second source electrode, and the data line is electrically connected to the first source electrode and the second source electrode.

5. A light detection device, comprising:
   a first light sensing unit disposed in a first pixel region;
   a first switching unit, comprising:
      a first source electrode; and
      a first drain electrode electrically connected to the first light sensing unit;
   a second light sensing unit disposed in a second pixel region;
   a second switching unit, comprising:
      a second source electrode; and
      a second drain electrode electrically connected to the second light sensing unit; and
   a readout circuit electrically connected to the first drain electrode and the second drain electrode for receiving a first readout signal generated by the first light sensing unit and a second readout signal generated by the second light sensing unit and comparing a difference between the first readout signal and the second readout signal to determine whether the light detection device is irradiated by detection light or not.

6. The light detection device according to claim 5, further comprising:
   a light shielding pattern covering the second light sensing unit.

7. The light detection device according to claim 5, further comprising:
   a first bias line partially disposed in the first pixel region, wherein the first light sensing unit is electrically connected to the first bias line; and
   a second bias line partially disposed in the second pixel region, wherein the second light sensing unit is electrically isolated from the second bias line.

8. The light detection device according to claim 5, further comprising:
   a data line electrically connected to the first source electrode and the second source electrode, wherein the readout circuit is electrically connected to the first source electrode and the second source electrode via the data line.

9. The light detection device according to claim 5, further comprising:
   a first gate line connected to the first gate electrode; and
   a second gate line connected to the second gate electrode, wherein the first gate line is disposed adjacent to the second gate line.

10. The light detection device according to claim 5, wherein the first pixel region is disposed adjacent to the second pixel region.

11. An operating method of a light detection device, comprising:
    providing a light detection device, the light detection device comprising:
       a first gate line;
       a first switching unit, comprising:
          a first gate electrode connected to the first gate line;
          a first source electrode; and
          a first drain electrode electrically connected to a light sensing unit;
       a second gate line disposed adjacent to the first gate line;
       a second switching unit, comprising:
          a second gate electrode connected to the second gate line;
          a second source electrode; and
          a second drain electrode electrically connected to a light sensing unit; and
       a readout circuit electrically connected to the first source electrode and the second source electrode; and
    performing an auto-detection mode, the auto-detection mode comprising:
    receiving a first readout signal from the first switching unit and receiving a second readout signal from the second switching unit by the readout circuit; and
    calculating a difference between the first readout signal and the second readout signal for determining whether the light detection device is irradiated by detection light or not.

12. The operating method of the light detection device according to claim 11, further comprising:

terminating the auto-detection mode and performing an image capturing mode when it is determinated that the light detection device is irradiated by the detection light in the auto-detection mode.

13. The operating method of the light detection device according to claim 11, wherein it is determinated that the light detection device is irradiated by the detection light when the difference between the first readout signal and the second readout signal is larger than a predetermined threshold value.

14. The operating method of the light detection device according to claim 11, wherein the auto-detection mode further comprises:
turning on the first switching unit and receiving the first readout signal by transmitting a first gate electrode signal to the first switching unit via the first gate line; and
turning on the second switching unit and receiving the second readout signal by transmitting a second gate electrode signal to the second switching unit via the second gate line, wherein a timing of the first gate electrode signal is different from a timing of the second gate electrode signal.

15. The operating method of the light detection device according to claim 11, wherein the first drain electrode and the second drain electrode are electrically connected to the same light sensing unit.

16. The operating method of the light detection device according to claim 11, wherein the light detection device further comprises:
a data line electrically connected to the first source electrode and the second source electrode, wherein the readout circuit is electrically connected to the first source electrode and the second source electrode via the data line.

17. The operating method of the light detection device according to claim 11, wherein the light sensing unit electrically connected to the first drain electrode and the light sensing unit electrically connected to the second drain electrode are disposed in different pixel regions respectively.

18. The operating method of the light detection device according to claim 17, wherein the light detection device further comprises:
a light shielding pattern covering the light sensing unit electrically connected to the second drain electrode.

19. The operating method of the light detection device according to claim 17, wherein the light detection device further comprises:
a first bias line partially disposed in the pixel region where the light sensing unit electrically connected to the first drain electrode is disposed, wherein the first light sensing unit is electrically connected to the first bias line; and
a second bias line partially disposed in the pixel region where the light sensing unit electrically connected to the second drain electrode is disposed, wherein the second light sensing unit is electrically isolated from the second bias line.

20. The operating method of the light detection device according to claim 11, wherein the detection light comprises an X-ray.

* * * * *